United States Patent [19]

Smith et al.

[11] Patent Number: 4,619,866

[45] Date of Patent: Oct. 28, 1986

[54] METHOD OF MAKING A COATED CEMENTED CARBIDE BODY AND RESULTING BODY

[75] Inventors: Ulf K. H. Smith, Huddinge; Jan N. Lindström, Norsborg, both of Sweden

[73] Assignee: Santrade Limited, Lucerne, Switzerland

[21] Appl. No.: 706,645

[22] Filed: Apr. 2, 1985

Related U.S. Application Data

[63] Continuation of Ser. No. 558,557, Dec. 5, 1983, abandoned, which is a continuation of Ser. No. 368,375, Apr. 14, 1982, abandoned, which is a continuation of Ser. No. 285,798, Jul. 22, 1981, abandoned.

[30] Foreign Application Priority Data

Jul. 28, 1980 [SE] Sweden ............................... 8005413

[51] Int. Cl.$^4$ .......................... B32B 9/00; B32B 19/00
[52] U.S. Cl. ..................................... 428/336; 427/249; 427/255; 427/255.2; 427/255.3; 427/255.7; 427/419.2; 427/419.7; 428/698; 428/701; 428/702
[58] Field of Search ..................... 427/249, 255, 255.2, 427/255.3, 255.7, 419.2, 419.7, 126.1, 126.3, 126.4, 85; 428/332, 698, 469, 472, 446, 689, 697, 699, 701, 702, 336; 423/630, 625

[56] References Cited

U.S. PATENT DOCUMENTS

| | | | |
|---|---|---|---|
| 3,664,866 | 5/1972 | Manasevit | 427/255.2 |
| 3,736,107 | 5/1973 | Hale | 428/332 |
| 3,813,292 | 5/1974 | Boonstra et al. | 428/702 |
| 3,836,392 | 9/1974 | Lux et al. | 428/335 |
| 3,914,473 | 10/1975 | Hale | 427/255 |
| 3,967,035 | 6/1976 | Hale | 427/255 |
| 4,018,631 | 4/1977 | Hale | 427/419.7 |
| 4,019,873 | 4/1977 | Reiter | 428/702 |
| 4,180,400 | 12/1979 | Smith et al. | 427/255 |
| 4,219,608 | 8/1980 | Nishiyama et al. | 428/702 |
| 4,282,289 | 8/1981 | Kullander et al. | 427/419.7 |

Primary Examiner—Sadie L. Childs
Attorney, Agent, or Firm—Burns, Doane, Swecker & Mathis

[57] ABSTRACT

In coating cemented carbide or ceramics, with thin, wear resistant layers of ceramic oxide, particularly aluminum oxide, by CVD, it has been very difficult to make sufficiently even layers and to obtain desired thickness of the layer within reasonable coating times. According to the invention an improved method utilizing a dopant selected from the group consisting of sulfur, selenium, tellurium, phosphorous, arsenic, antimony, bismuth and mixtures thereof, is now available by which a considerable increase of the growth rate of the layer as well as optimal properties regarding evenness and thickness of the layer have been obtained, making the product better suited for cutting operation.

28 Claims, 3 Drawing Figures

METHOD OF MAKING A COATED CEMENTED CARBIDE BODY AND RESULTING BODY

This application is a continuation of application Ser. No. 558,557, filed Dec. 5, 1983, now abandoned, which is a continuation of application Ser. No. 368,375, filed Apr. 14, 1982, now abandoned, which is a continuation of application Ser. No. 285,798, filed July 22, 1981, now abandoned.

The present invention relates to a method of producing thin, even and extremely wear resistant surface layers of ceramic oxide, preferably aluminum oxide, on cemented carbide substrates. The latter may be uncoated or have coatings produced in other processes or in process steps immediately preceding the process step described hereinbelow.

It is known that the wear resistance of pressed and sintered cemented carbide bodies, as for example, inserts for chipforming machining, can be increased considerably by applying hard surface layers. In particular, coatings of metal carbides, metal nitrides or metal oxides have been applied as thin layers (having, for example, a thickness between 0.1 to 20 $\mu$m) on the cemented carbide core or the substrate. It is also known that further advantages can be reached in certain cases by using a thin coating composed of two or more different layers applied on top of each other, for example, the use of a metal carbide or nitride as an intermediate layer below an outer ceramic layer. Aluminum oxide ($Al_2O_3$) and zirconium oxide ($ZrO_2$) are examples of such ceramic surface layers.

The main method of applying the surface coatings is the CVD-technique or "Chemical Vapor Deposition," in which the coatings are deposited on a hot substrate by reaction between gaseous components. For the production of ceramic oxide coatings, the most common chemical vapor deposition system which has been employed utilizes a hydrolysis reaction of a metal halide to form the specific ceramic oxide, the metal halide being either evaporated directly or formed by the reaction between the specific metal and halogen or hydrogen halide. The hydrolysis reaction is performed with water vapor, which is either evaporated directly or formed in situ by the reaction between hydrogen and carbon dioxide or oxygen. For the production of aluminum oxide coatings, aluminum chloride is hydrolyzed.

The formation of an aluminum oxide coating depends, among other things, upon the diffusion of species from the substrate and/or the gas phase. The relationship between the various diffusion, nucleation and growth mechanisms which govern the formation of a coating are of a very critical nature and are often difficult to govern in the desired direction. Thus, it can be extremely difficult to produce relatively thick coatings of aluminum oxide using known processes if the coatings are to be uniformly distributed around the coated body. If one wants to use the known processes (see for example Swedish Pat. No. 357,984; U.S. Pat. Nos. 3,736,107; 3,836,392; and Swedish Pat. No. 406,090) in order to produce such coatings, drastic modifications of the coating conditions are needed. However, such modifications often give rise to conditions in the process, which are harmful to the substrate or lead to significant reduction of production capacity.

The present invention now makes it possible to produce cemented carbide bodies having ceramic oxide, preferably aluminum oxide, coatings of uniform thickness around the individual body and with, among other things, thicknesses in ranges of interest in cutting applications. The coatings pertaining to the invention can be applied to previously coated as well as uncoated cemented carbide substrates, e.g., substrates containing at least one carbide in addition to the binder metal. The coatings can also form surface or intermediate layers in multiple coatings of various kinds. The coating can advantageously be deposited on intermediate layers of wear resistant carbides, nitrides, carbonitrides, oxides, borides or combinations and/or mixtures of such compounds, applied in the form of one or more successive layers. The invention can also be of advantage in the deposition of coatings on ceramic bodies.

The carbides, nitrides, oxides and borides mentioned above, as well as combinations thereof may be those of one or several of the elements Ti, Zr, Hf, V, Nb, Ta, Cr, Mo, W, Si and, where applicable, B.

Layers of titanium carbide, nitride and/or carbonitride are especially suited as intermediate layers.

When the aluminum oxide coating is deposited, a gas consisting of one or more halides of aluminum and heated to a high temperature is brought in contact with the substrate. It has now quite surprisingly been found that thin as well as thick, even aluminum oxide coatings and a great increase of the growth rate of the aluminum oxide layer are obtained by supplying a controlled amount of sulfur, selenium, tellurium, phosphorus, arsenic, antimony and/or bismuth to the substrate during the deposition.

A distinct feature of the invention is that a controlled amount of a dopant selected from the group consisting of sulfur, selenium, tellurium, phosphorus, arsenic, antimony, bismuth, and mixtures thereof is supplied to the substrate region during the deposition. The dopant is preferably sulfur or phosphorus and the process of the present invention will be described below with reference to sulfur or phosphorus (unless otherwise indicated) although it will be understood that it is equally applicable to selenium, tellurium, arsenic, antimony, bismuth and mixtures of all the various dopants. A suitable form for this additional supply of the dopant is a gas with molecules containing the elements mentioned. According to the present invention, sulfur, phosphorus and/or corresponding elements are generally introduced in the process in compound form. However, in order that the effects encompassed by the invention be realized, it is important that the compound used for the supply of sulfur or phosphorus is not only of adequate purity but also free from elements which have a detrimental effect on the process itself or on the product made by means of the process. The sulfur or phosphorus containing component (or components) participating in the process should therefore be of such a composition that it (they) does not contain any foreign elements which are harmful to the process. As known in the CVD-art, silicon is an element which is considered harmful. Other elements or compounds which would also interfere with the straight forward manner of the process of the present invention should also be avoided. An example of a compound which satisfies these requirements and which permits a carefully controlled and optimized introduction into the gas mixture used in the process is hydrogen sulfide ($H_2S$) or phosphorus chloride ($PCl_3$) Carbonoxysulfide (COS) or phosphine ($PH_3$) can also be used.

When sulfur or phosphorus (selenium, tellurium, arsenic, antimony, bismuth or mixtures thereof) is introduced into the process in accordance with the present invention, a large increase in the growth rate of the aluminum oxide coating is quite surprisingly obtained in such a way that requirements regarding a uniformly thick coating of aluminum oxide around the coated body are met. A coating produced according to the present invention has quite surprisingly, such mechanical, physical and chemical properties as to provide the coated body with a performance in technologically interesting applications which clearly exceeds the performance of products manufactured by means of similar processes not using the method which characterizes the present invention. If, on the other hand, the process described by the invention is adjusted with respect to coating thickness and thickness distribution in such a manner that the finished product is more or less identical with products manufactured by means of known processes, quite surprisingly, a product is obtained having a performance which is in no way inferior to that of the latter products.

These unexpected effects of the invention can be observed quite easily, among other things in the technologically important areas of cutting and wear. In all those instances where excessive coating thicknesses around edges and corners are disadvantageous, a considerably improved performance is obtained when products are used that have been manufactured according to the process described by the present invention. The explanation as to why the invention leads to such a drastic modification of the growth mechanisms of the aluminum oxide coating is of a theoretically complex nature and is at present not clear, but it can be mentioned that the effects caused by the process as described by the invention are remarkably similar to what is to be expected from such chemical processes which depend upon catalysts and surface catalyst poisoners. As far as it is presently known, the product described by the invention cannot be manufactured by means of other known processes for aluminum oxide coatings and the processes of the present invention is definitely the most simple method of production available so far.

The process described by the invention can thus give rise to an increased rate of deposition as compared to processes which do not make use of sulfur, phosphorus and similar aditions.

Depending upon the amount of sulfur or phosphorus added to the gas phase, growth rates can be obtained which with about 4 $\mu$m/h per vol-% $H_2S$ (in the concentration range 0.01-0.2% $H_2S$) or more exceed the rate 0.1 $\mu$m/h typical for coatings produced without the addition of sulfur or phosphorus (c.f. the examples below).

In addition to increasing the rate of production of coatings, the increase in the rate of deposition is of direct benefit for the quality of the coating in that an increased rate reduces the period of time during which coating and substrate are treated at a high temperature. This reduces the probability of detrimental changes in the structure and composition of coating and substrate and intermediate zone respectively which might occur as a result of prolonged exposure to higher temperatures. As has been indicated above, the principal method of producing an aluminum oxide coating is, according to the invention, by means of CVD-techniques in combination with an addition of phosphorus and/or sulfur and/or equivalent elements. This applies to substrates consisting exclusively of hard materials (together with a binder metal where applicable) as well as for substrates already having one or more coatings.

If necessary, the cemented carbide substrate may have a surface region enriched with respect to the so-called gamma phase. This holds true for those instances when additional layers are to be added on to the aluminum oxide coating produced according to the invention. A CVD-process made according to the invention can be done in a step separate from the deposition of the other layers but should preferably be made successively in the same apparatus so that well-defined surfaces are available for each deposition step.

An amount of methane from about 0.5 to about 90 vol. % of the total amount of the supplied gas may be added to the gas for the $Al_2O_3$ coating step so that at least a substantial portion, often at least about 85%, of the $Al_2O_3$ is in the kappa form. The methane thus acts in the same manner as the dopant disclosed in commonly assigned U.S. Pat. No. 4,180,400 and may be added in conjunction with the phosphorus or sulfur dopant or alone in those instances where the kappa form is desired and uneven $Al_2O_3$ layers are not critical.

The aluminum oxide coating is typically 0.1-20 $\mu$m and preferably 0.3-9 $\mu$m. The thicknesses of the intermediate or of the successive layers, on top of as well as beneath the aluminum oxide layer under consideration, normally fall in the range of 0.1-20 $\mu$m, that is, they are of the same order of magnitude.

In those instances when intermediate coatings of wear-resistant carbides, nitrides, carbonitrides and borides as well as combinations thereof are applied, the thickness of the aluminum oxide layer is usually 0.1-15 $\mu$m.

When higher amounts of sulfur or phosphorus are added, that is, amounts of about 0.05-1 vol. % $PCl_3$, intermediate layers are obtained beneath and/or within the outer ceramic layer (e.g., $Al_2O_3$). The intermediate layers contain sulfur or phosphorus and metal diffused from the substrate e.g., the binder phase of the substrate. Such an intermediate layer can consist of $Co_2P$ or $Co_2S$. The thickness is about 0.3-3 $\mu$m. Sulfur or phosphorus may also occasionally diffuse into the cemented carbide substrate.

Further, when phosphorus is added, as a dopant, the outer layer zone can be enriched in metal diffused from the binder phase of the substrate, e.g. Co. Similar effects may be obtained with the other dopants, particularly those of the phosphorus group (P, As, Sb, Bi).

The method used in producing cemented carbide bodies and ceramic bodies in accordance with the invention are illustrated by means of Examples 1 to 23 below and by the Figures in which.

Figure 1:
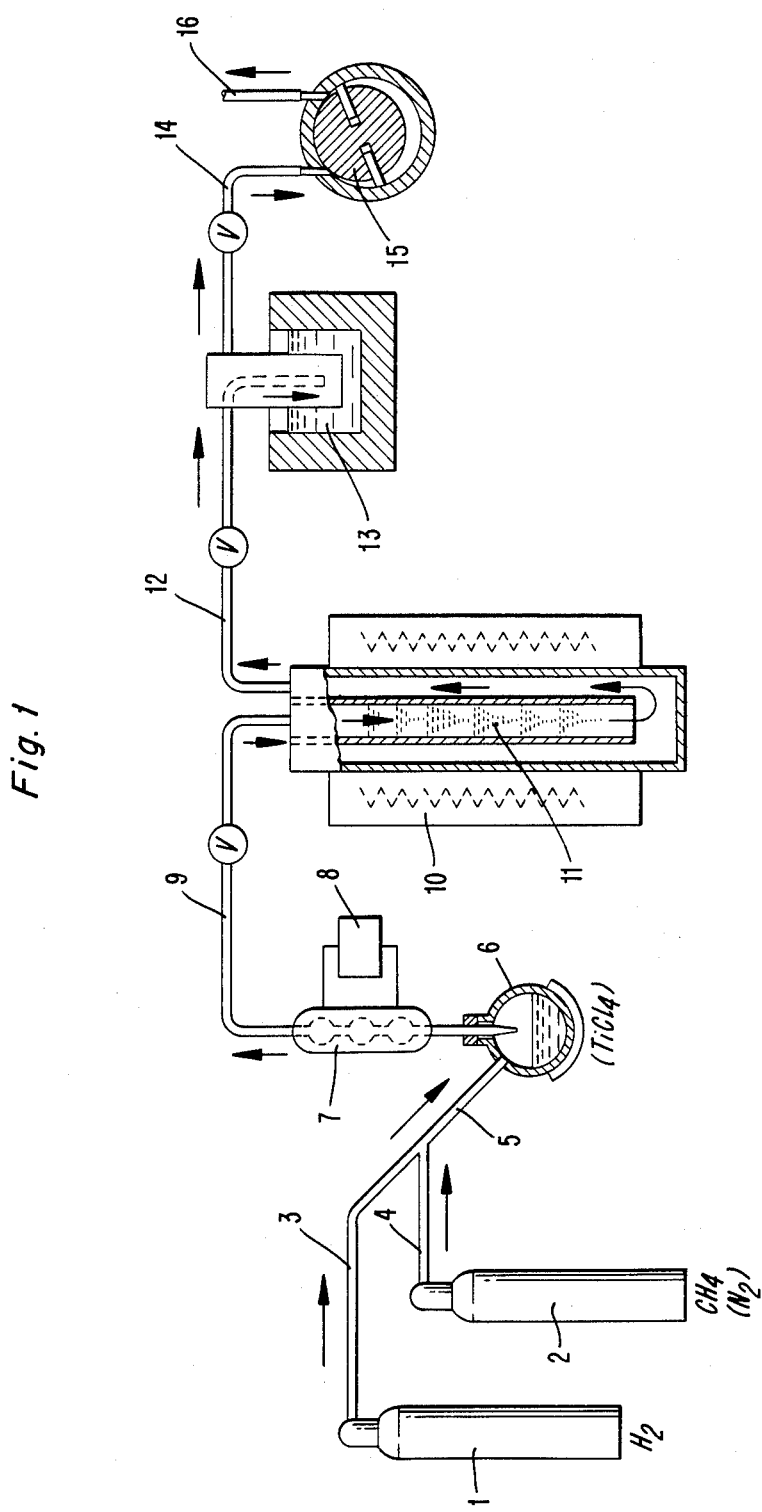
FIG. 1 is a sketch of production apparatus useful in coating a substrate with suitable metal carbide, nitrides and/or carbonitride.

The equipment shown in FIG. 1 consists of sources of gas, for example gas tubes 1 and 2 for the supply of hydrogen, methane and/or nitrogen. The conduits 3 and 4 each join a source of gas with conduit 5 through which the gas mixture is transported to a vessel 6 where a metal halide, e.g., $TiCl_4$, is heated so as to give off an adequate amount of vapor. The mixture of these gases is then fed to the reactor 11 via a common conduit 9. The gas mixture thereby passes a heat exchanger 7 which is controlled by a thermostat 8 so that the amount of $TiCl_4$, in the gas mixture is held at the correct level. The substrate to be coated is placed in the reactor 11, the latter being heated by an oven 10. The gas is sucked out of the reactor via a conduit 12 equipped with a valve and a cold trap 13. The system is evacuated via conduit 14 by means of a vacuum pump 15 with an exhaust pipe 16.

Figure 2:
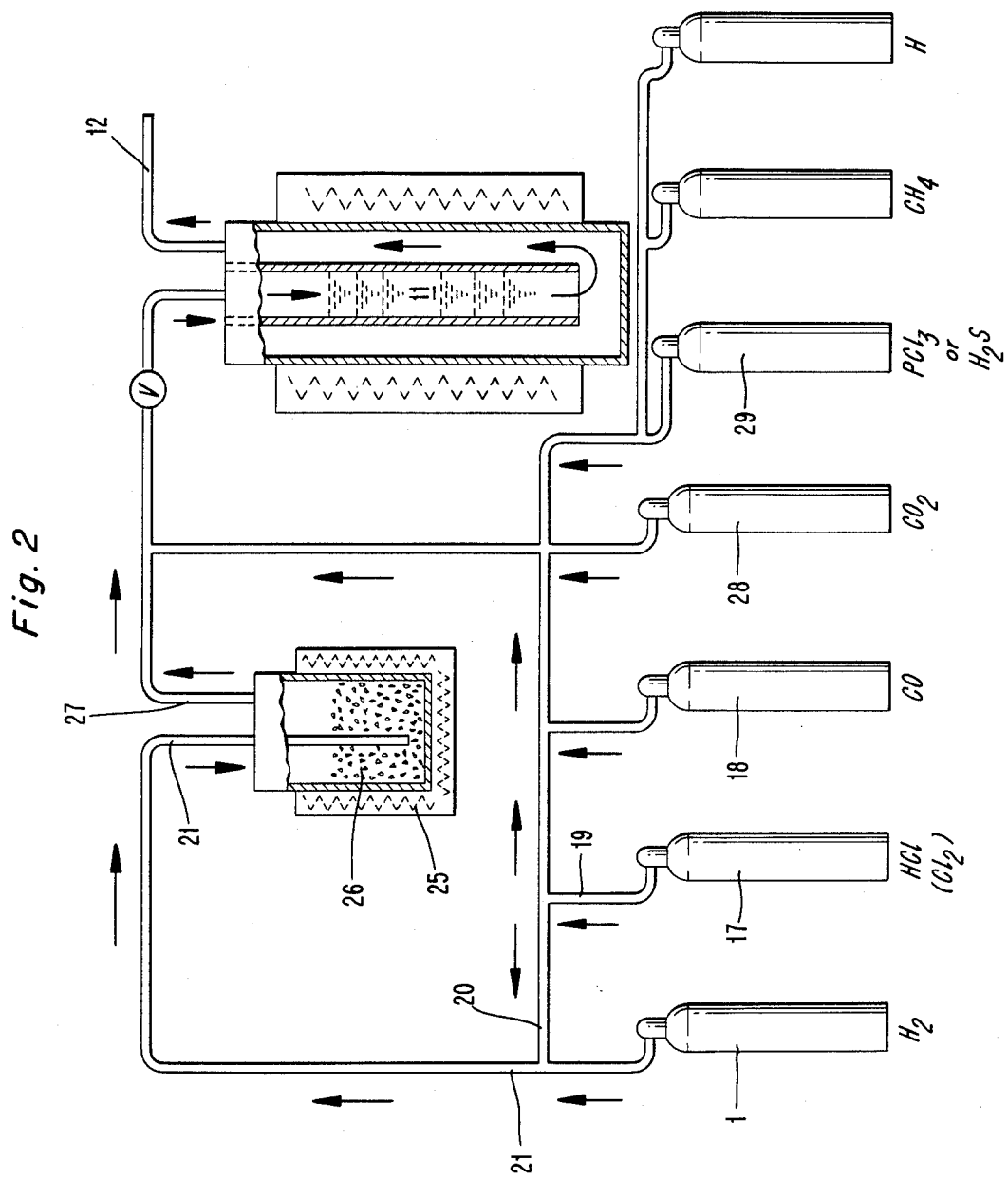
FIG. 2 is a sketch of equipment useful in coating a substrate with aluminum oxide.

The equipment outlined in FIG. 2 illustrates the use of a separate reactor 25 for the chlorination of Al, the latter being in the form of e.g., grains or chips 26. In order to obtain this chlorination, hydrogen from a source of gas 1 is mixed with chlorine or hydrochlorine via conduits 19 and 20, the latter coming from the source 17. The mixture is then brought to the chlorination reactor via a conduit 21.

The gas mixture from the chlorination reactor 25 is then further mixed with hydrogen, as well as with carbon monoxide and carbon dioxide from the sources 18 and 28 respectively. This gas mixture is then routed to the deposition reactor 11 via the conduit 27 which is equipped with a valve. (The system for purifying the gases have been left out in the Figures).

The deposition of aluminum oxide can thus be performed by means of a process namely hydrolysis of an aluminum halide, viz. preferably a chloride ($AlCl_3$), using water vapor (oxyen).

As indicated above, the aluminum halide can be produced in the form of a gas either by evaporation of the solid or liquid phase or by reacting metallic aluminum with chloride or hydrochlorine gas 26. The water vapor can be added to the gas phase either by evaporation of water or, preferably, by reacting hydrogen with carbon dioxide 28. Sulfur or phosphorus can be added to the gas phase by adding preferably gases or gas mixtures 29 containing sulfur, phosphorus or compounds thereof. Preferably the addition is made in the form of hydrogen sulfide ($H_2S$) or phosphorus chloride ($PCl_3$), which is introduced throughout the whole process or part of the process. Sulfur, phosphorus or their compounds may also be generated in the reactor in situ.

The reactants are fed into the reactor 11, in which the bodies which are to be coated have been placed. The bodies can be heated either directly by means of induction heating or indirectly by heating e.g., supporting plates or the reactor itself by e.g., resistance heating 10. The deposition temperature can be in the range 700° C. to 1200° C., but preferably in the range 950° C. to 1150° C.

The concentrations of aluminum chloride vapor in the gaseous mixture of reactants should preferably be over stoichiometric with respect to the water vapor. The concentration of the dopant-containing gas should be in the range 0.003–1, preferably in the range 0.02–0.3 vol. % per atom of S, Se, Te, P, As, Sb and/or Bi in the gas molecule as referred to the total gas volume being brought into the reactor.

It is also important that the concentration of carbon dioxide be monitored carefully. The amount of the dopant-containing gas recommended above refers to the case of roughly stoichiometric proportions of carbon dioxide and aluminum chloride in the gas entering the reactor at a temperature of 1000° C. and 6 kPa. The total pressure of the gaseous phase may be in the range of 0.1–100 kPa, but should preferably be in the range 1–30 kPa.

It is often easy to demonstrate the presence of sulfur or phosphorus in a coating or in adjacent parts of the substrate including any intermediate layer by means of microprobe analysis. More sophisticated methods of analysis, e.g., ion-microprobe, proton induced x-ray emission spectroscopy or Auger analysis can be used to detect even extremely small amounts of sulfur or phosphorus or effects caused by their presence. Excellent performance has been observed when the coating and/or the surface of the substrate have contained minor amounts, e.g., more than 0.1 weight - %, of sulfur, selenium, tellurium, phosphorus, arsenic, antimony and/or bismuth. It will be understood that significant amounts of these elements need not be present and could adversly affect the use of the coated bodies in certain applications, i.e., wear-resistant cutting inserts.

Examples will be given below in order to illustrate various conditions which can be used to produce aluminum oxide coatings according to the invention. Results from tests using bodies coated in such a manner will also be given.

Finally, it deserves to be emphasized that within the scope of the invention one can also find coatings consisting of other ceramic oxides than aluminum oxide as well as other wear resistant compounds containing ceramic oxide such as solid solutions etc. which can be produced from the gaseous phase in ways similar to what has been described above. Improved performance due to an optimized addition of sulfur or phosphorus has thus been observed in these cases as well.

The invention is additionally illustrated in connection with the following Examples which are to be considered as illustrative of the present invention. It should be understood, however, that the invention is not limited to the specific details of the Examples.

EXAMPLE 1

Coating with an intermediate layer of TiC is performed in a reactor, the essential parts of which are made of "Inconel" alloy.

In this reactor vessel, 3000 sintered cemented carbide inserts are heated to 1000° C. The inserts to be coated are produced according to ISO Standard M20 and contain cubic carbides and WC.

The inserts are placed on strainer-like plates providing good contact with the surrounding gas. The gas, which consists of a mixture containing 10% $TiCl_4$, 8% $CH_4$ and 82% $H_2$, by volume, manufactured in a normal way, is brought to the reactor in one single conduit. The presence in the reactor is maintained at 2 kPa by sucking out the gas from the reaction vessel by means of a vacuum pump protected from corrosive reaction products (for instance HCl) by the help of a cooling trap with liquid nitrogen situated ahead of the pump. In this way a linear gas flow rate of 1 m/sec is obtained in the charge.

The inserts are treated for 2 hours.

As a result of the treatment, a fine-grained, tight TiC-layer of about 2 μm thickness is obtained. The amount of embrittling η-phase, because of decarburizing, is very small.

In a separate, second step the 3000 inserts are treated in an apparatus nearly identical to the one described, the gas supply system being modified, however, so that a gas with the composition 69.9 $H_2$, 5% $CO_2$, 20% CO, 0.1% $H_2S$ and 5% $AlCl_3$ (by volume) can be used.

The temperature of the substratum is 1050° C. and the pressure 5 kPa. A linear gas flow rate of 5m/sec is used. After a coating time of 3 hours, a 3 μm thick layer of $Al_2O_3$ is formed on the TiC-coated cemented carbide inserts. The binding between the $Al_2O_3$ layer and TiC layer is good and almost no embrittling $\eta$-phase is formed. Some cemented carbide inserts of the same type and grade but not coated with TiC, are, in the same $Al_2O_3$ coating operation, given a 15 $\mu$m thick, porous and poorly adhering layer of $Al_2O_3$.

A cutting test is performed in the form of continuous turning in cast iron, grade SIS 0125 (composition C=3.4%, Si=1.5%, Mn=0.7%, HB 220) under the following conditions:
Cutting speed: 200 m/min
Feed: 0.3 mm/rev
Depth of cut: 2 mm
Style of insert: SPUN 120308

The tool life, measured according to current standards, is estimated as follows:

| Grade corresponding to | Life of inserts (min) |
| --- | --- |
| 1 ISO M2O, uncoated | 6.6 min (standard) |
| 2 ISO M2O, TiC-layer only, 4 $\mu$m thick | 20.3 min (standard) |
| 3 ISO M2O, TiC + $Al_2O_3$-layer (2 + 2 $\mu$m, each) | 30.3 min (without $H_2S$) |
| 4 ISO M2O, TiC + $Al_2O_3$-layer with $H_2S$ (2 + 3 $\mu$m) | 48.7 min |
| 5 ISO M2O, $Al_2O_3$-layer only | 8 min (without $H_2S$) |

According to these results it is evident that the insert produced according to the invention (No. 4 in the Table above) gives a superior tool life compared with the remaining inserts.

EXAMPLE 2

Specimen group (a)

This specimen group is produced in a similar manner as described in Example 1, except for some differences mentioned in the following:

1. Titanium carbide layer and aluminum oxide layer are deposited without cooling down between the process steps.
2. 4 $\mu$m TiC is deposited using the following conditions:

| Gas velocity | 1 m/s | Gas composition: | |
| --- | --- | --- | --- |
| Temperature | 1020° C. | $CH_4$ | 4% |
| Pressure | 7 kPa | $TiCl_4$ | 4% |
| Time | 7 h | $H_2$ | balance |

3. 1 $\mu$m $Al_2O_3$ is deposited using the following conditions:

| Gas velocity | 3 m/s | Gas composition: | |
| --- | --- | --- | --- |
| Temperature | 1030° C. | $H_2S$ | 0.07% |
| Pressure | 7 kPa | $CO_2$ | 5% |
| Time | 3 h | HCl | 2% |
| | | $AlCl_3$ | 2% |
| | | $H_2$ | balance |

4. Substrate: WC 86% (by weight), cubic carbides (TiC, TaC, NbC) 9%, balance being Co.
Only minor amounts of eta phase are obtained.

Specimen group (b)

Inserts coated without $H_2S$ during similar conditions but for 8 h coating time to obtain 1 $\mu$m $Al_2O_3$. On the edges of the inserts, however, a coating thickness of 2-8 $\mu$m $Al_2O_3$ is obtained.

Comparative test:

In a comparative intermittent finishing operation (work piece Steel SIS (Swedish International Standard) 2541) analyses : C=0.36, Si=0.30, Mn=0.7, S=0.03, Cr=1.4, Ni=1.4, Mo=0.2 %, Hardness: 290HB (work piece diam. 160–140 mm, length 700 mm, with one milled longitudinal slot, width 25 mm) the following test is run:
Cutting speed: 300 m/min.
Depth of cut: 1.0 mm
Feed: 0.15 mm/rev.

The operation is performed as paired comparative tests of inserts according to the invention (a) and inserts according to (b), results in the following relative tool life values:
(a) 1.0
(b) 0.55

EXAMPLE 3

The Example is carried out similarly to Example 2 but with the following modifications:

(a) The time for TiC-deposition is 6 h and for $Al_2O_3$-coating 8 h (substrate with a relatively high carbon content). The inserts are coated with 5 $\mu$m TiC+3 $\mu$m $Al_2O_3$.

(b) Inserts are coated similar to (a) but COS is used instead of $H_2S$ as the dopant. 3 $\mu$m of $Al_2O_3$ is obtained.

(c) Inserts coated with 5 $\mu$m TiC+0.8 $\mu$m $Al_2O_3$ in accordance with conventional technique (no dosage of sulfur). (Compare U.S. Pat. No. Re. 29,420, Example 7).

(d) Inserts are produced according to (c), but in this case the inserts are placed with a much greater space between the objects to be coated and the temperature is increased to 1060° C. during the oxide deposition in order to obtain 5 $\mu$m TiC+3 $\mu$m $Al_2O_3$ coatings.

(e) Insert coated with a layer of 3 $\mu$m TiC+3 $\mu$m $Al_2O_3$ in accordance with conventional technique (compare U.S. Pat. No. 4,180,400 Example 2).

(f) Insert coated with a layer of 5 $\mu$m $Al_2O_3$ in accordance with conventional technique (compare U.S. Pat. No. 3,836,392, Example 3) obtained in an experiment in a laboratory scale reactor.

(g) Insert coated with a layer of 4 $\mu$m $Al_2O_3$ in accordance with conventional technique (compare U.S. Pat. No. 3,736,107, Example 3)—however, in this case considerably thicker layers were obtained on the edges.

The inserts produced in accordance with the invention ((a) and (b)) are distinguished by their evenly distributed $Al_2O_3$ coating all around the inserts, whereas the inserts (c) through (g) are unevenly coated by $Al_2O_3$ (thicker layers on edges, approximately in increasing degree (c) through (g)).

Cutting operations are carried out similar to Example 1 on another work piece of this same type. The inserts are divided into two test groups. Samples (a) through (d) constitute the first group, whereas (e) through (g) constitute the other. Additionally, in the second group an insert produced in accordance with (a) is tested in order to make a comparison between the two groups. The relative tool life for inserts produced in accordance with (a) is arbitrarily assigned number 10.

| Tested insert | Substrate (cemented carbide grade) | Tool life (relative) |
| --- | --- | --- |
| (a) | see above (according to invention) | 10 |
| (b) | as in (a) | 9 |
| (c) | as in (a) | 6 |
| (d) | as in (a) | 8 |
| (e) | as in (a) (approximately, | 8 |

-continued

| Tested insert | Substrate (cemented carbide grade) | Tool life (relative) |
|---|---|---|
| | compare Ex. 2 U.S. Pat. No. 4,180,400) | |
| (f) | as in (a) | 6 |
| (g) | as in (a) but without coating | 3 |
| Reference, uncoated | as in (a) but without coating | 1 |

EXAMPLE 4

Figure 3:
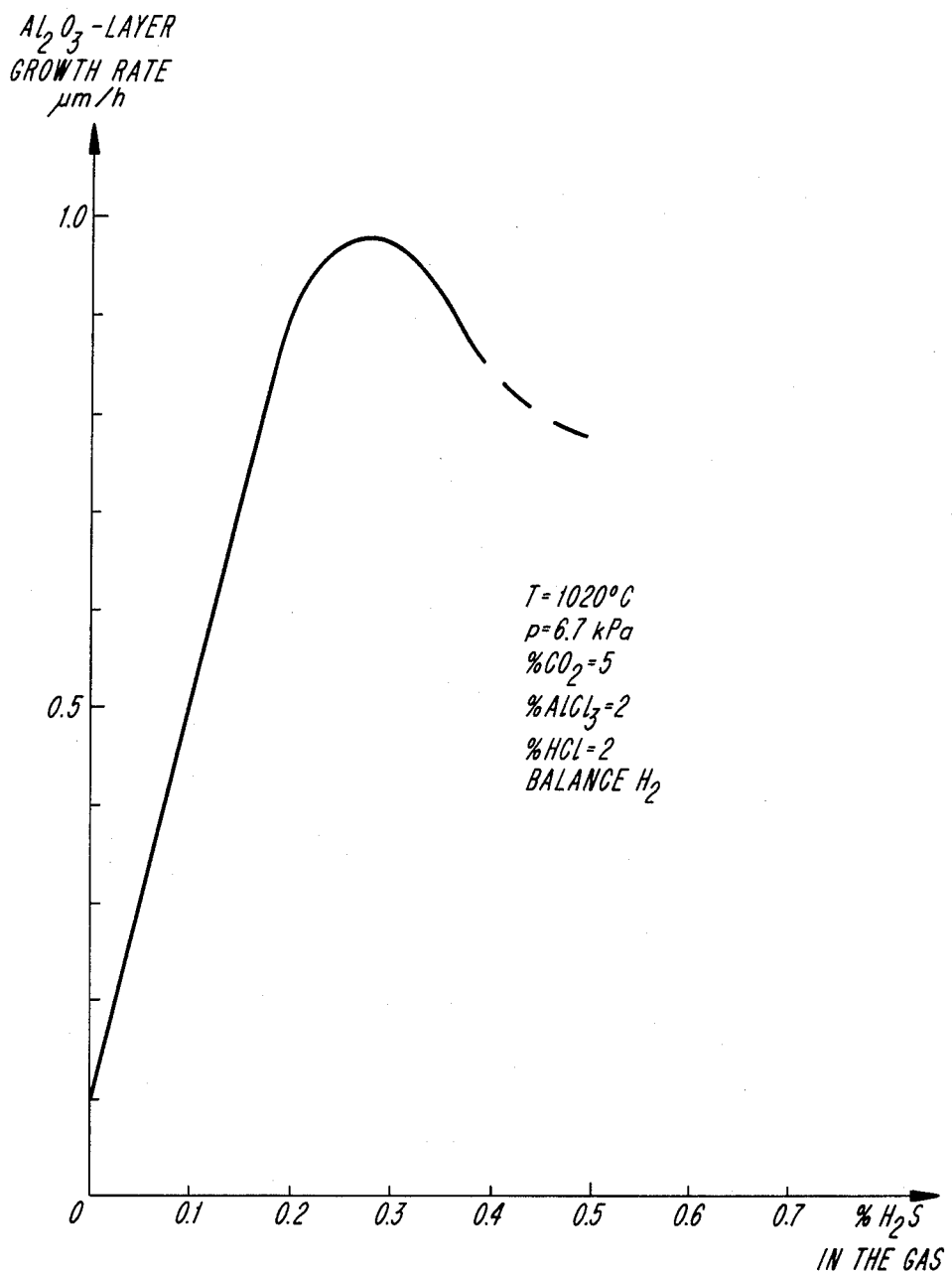
FIG. 3 is a graph or the growth rate of the alumina coating vs. amount of $H_2S$ in the gas.

Coating of a TiC-coated cemented carbide substrate with $Al_2O_3$ is perforated using a CVD technique at a temperature of 1020° C. and a pressure of 8 kPa. The gas composition is $CO_2$ 5%, $AlCl_3$ 2%, HCl 2%, balance being $H_2$, but a variable amount of $H_2S$ is added during the deposition process. The growth rate of the $Al_2O_3$-layer formed (μm/h) is measured at various amounts of $H_2S$. The results are shown in FIG. 3. It should be noted that the growth rate increases considerably with small amounts of added $H_2S$, and the optimal growth rate is achieved at larger amounts of $H_2S$.

EXAMPLE 5

Inserts are produced comprising a surface zone of gamma phase using the following method.

The substrate is chosen in accordance with Example 1.

The inserts are treated in a nitrogen atmosphere (pressure 5 kPa) at 1410° C. for 30 minutes (graphite in the furnace), whereafter the inserts are cooled. Grains of gamma phase have been enriched in the surface zone of the inserts to a 0.5-2 μm thick continuous zone.

These inserts are coated in four different manners with $Al_2O_3$ ((a) and (b)) or $TiC+Al_2O_3$ ((c) and (d)).

(a) With 5 μm $Al_2O_3$ as in Example 3(a)—however, the duration of the deposition is increased about 70% and the amount of HCl is increased to 3.5%.

(b) With 5 μm $Al_2O_3$ but without $H_2S$ (deposition as in Example 3(d)—the duration of the deposition is increased with 70% and the HCl content to 3.5%).

(c) Coating with $Al_2O_3$ is performed in accordance with (a) but a very thin TiC-layer (0.2 μm) is positioned immediately under the $Al_2O_3$-layer. The TiC coating is deposited in accordance with Example 2 but the duration of the deposition is decreased to 1 h.

(d) TiC-layer as in (c) and $Al_2O_3$-layer as in (b).

No embrittling η-phase can be detected in the surface zones. The inserts are tested in cast iron of the same kind as in Example 1. The inserts reveal similar results, but in order of decreasing tool life (c), (a), (d) and (b).

The inserts produced without any $H_2S$ in the gas have comparatively thicker $Al_2O_3$-layers in edge areas, which causes rapid flank wear. The inserts according to (a) and (c) on the other hand have very even layers of $Al_2O_3$ all over the coated objects.

EXAMPLE 6

The same kind of equipment for deposition as in Example 1 is used. 800 inserts style TNMM 120308, substrate cemented carbide grade according to ISO standard M20, are separated into two groups, which are coated with and without $H_2S$. In group (a) $H_2S$ is added, the group (b) inserts being coated the same way except that the $H_2S$ is not added to the coating gas composition.

In the following conditions for group (a) are given.

After heating in $H_2$ the inserts are coated with 5 μm TiC:

| Temperature: | 1030° C. | Gas composition: | |
|---|---|---|---|
| Pressure: | 7 kPa | $TiCl_4$ | 4% |
| Time: | 7 h | $CH_4$ | 4% |
| Gas velocity: | 1 m/s | $H_2$ | balance |

The starting up procedure is 70 minutes.

After a total transition time of 1.5 h, in which $H_2S$-flow is added as a last step, the following $Al_2O_3$ coating process is used in order to obtain an about 2 μm thick $Al_2O_3$-layer (group (b) inserts obtain about 1 μm $Al_2O_3$):

| Temperature: | 1030° C. | Gas composition: | |
|---|---|---|---|
| Pressure | 7 kPa | $AlCl_3$ | 2% |
| Time: | 6 h | HCl | 2% |
| Gas velocity: | 4 m/s | $CO_2$ | 5% |
| | | $H_2S$ | 0.025% |
| | | $TiCl_4$ | 0.025% |
| | | $H_2$ | balance |

After the completion of the TiC deposition, 0.5 h elapses before the $Al_2O_3$-deposition is started.

The deposition was terminated by an extra process step whereby an extra very thin (about 0.2 μm) layer of yellow TiN is deposited. This is immediately after the $Al_2O_3$ deposition.

| Temperature: | 1030° C. | Gas composition: | |
|---|---|---|---|
| Pressure: | 7 kPa | $TiCl_4$ | 4% |
| Time: | 0.5 h | $N_2$ | 48% |
| Gas velocity: | 2 m/s | $H_2$ | 48% |

By microscopic investigation it is shown that the inserts of group (a) have got a considerably more even distribution of the $Al_2O_3$-layer around the inserts than inserts of group (b).

A continuous cutting operation is performed in a work piece material SKF 25 B (composition: C=1.0, Si=0.3, Mn=0.3, Cr=1.8, Mo=0.35 % by weight, HB (hardness)=210) at the following conditions:

Cutting speed: 220 m/min.
Feed rate: 0.36 mm/rev.
Depth of cut: 2 mm

The relative tool life determined according to current norms is
(a) 1.3
(b) 1.0

EXAMPLE 7

Inserts are produced in accordance with Example 6 excepting that a 0.2 μm thick TiN-layer is not deposited. The difference between inserts of group (a) and (b) is the same as in Example 6.

The inserts are tested in cast iron of the same kind as in Example 1 with the following cutting conditions:
Cutting speed: 200 m/min.
Feed rate: 0.3 mm/rev.
Depth of cut: 2 mm
Insert style: SPUN 120308

The relative tool life determined according to current norms is the following:
(a) 1.7

(b) 1.0

EXAMPLE 8

Inserts are made according to Example 2(a) with the exception that 0.5 μm TiN is deposited immediately after the TiC-coating using conditions as in Example 6.

EXAMPLE 9

Inserts are produced as in Example 8 but 0.3 % $H_2S$ is added to the gas. The duration of the $Al_2O_3$-deposition can be reduced by 50%.

EXAMPLE 10

Inserts are produced as in Example 8 but 0.5% $H_2Se$ is added to the gas mixture (the amount of $H_2S$ is reduced accordingly).

EXAMPLE 11

The following deposition conditions are used for a coating experiment in a vertical tube furnace with an internal diameter of 4 cm:
Temperature: 1000° C.
Pressure: 7 kPa
Time: 30 min.
$CO_2$: 200 cm$^3$/min NTP
$H_2$: 200 cm$^3$/min NTP
$AlCl_3$: 0.8 cm$^3$/min NTP
$H_2S$: 0.2% (a)
$H_2S$: 0.0% (b)

The same type of substrate as in Example 1. No TiC intermediate layer was deposited.

A cutting test yields similar results in two cases, one with and one without $H_2S$.

The distribution of the layer around the inserts is more even when $H_2S$ is used.

EXAMPLE 12

Inserts are coated similarly to Example 6 except that $TiCl_4$ is not dosed during the $Al_2O_3$ deposition step.

The amount of $H_2S$ is 0.12% and the duration of the $Al_2O_3$ deposition is 8 h. Style of inserts: SPUN 120308.

A cutting test is performed similarly to Example 6 except that a feed rate of 0.45 mm/rev. is used.

Inserts of group (a) reveal a tool life of 1.2 relative to the inserts of group (b) (with no $H_2S$), which are assigned a tool life of 1.0.

By inspection in a microscope it is evident that inserts of group (a) have considerably more evenly distributed layers around the inserts than inserts of group (b).

EXAMPLE 13

Inserts are coated in accordance with Example 2, but instead of TiC as an interlayer NbC produced in accordance with a known method is used. (The inserts are coated by NbC in a separate process step with an intermediate cooling period.)

EXAMPLE 14

Inserts (group (c)) are coated similar to Example 12. Substrate: ISO standard P40, style of inserts TNMM 160408.

In a turning test using a work piece material of grade SKF 25 B (see Example 6) the following conditions are used:
Feed rate: 0.36 mm/rev
Depth of cut: 2 mm
Cutting speed: 200 m/min
The following inserts are tested:
(a) TiC-layers about 5 μm (GC 135=commercial Sandvik grade)
(b) Inserts with about 1 μm $Al_2O_3$ on top of 5 μm Tic (compare (a))
(c) Inserts according to this Example.
Achieved tool lives:
(a) 10 min
(b) 13 min
(c) 20 min

EXAMPLE 15

Ceramic inserts are coated in accordance with Example 5. Remarkably evenly distributed layers of $Al_2O_3$ are obtained.

EXAMPLE 16

Inserts are coated in the same manner as in Example 2(a) except that the flow of $CH_4$ is increased by a factor of four after the TiC deposition in order to obtain about 5 % $CH_4$ during the $Al_2O_3$ deposition step.

Inserts produced according to Example 2 give a large percentage of the alpha modification of $Al_2O_3$ (more than 90% of the surface). Inserts produced according to Example 16 give only about 1–75 % alpha modification, the rest being the kappa modification.

In a cutting test performed similarly to the one described in Example 2 the following results are achieved:
Relative tool lives:
(a) 1.0 (a) as in Example 2
(b) 0.45 (b) as in Example 2
(c) 1.2 Example 16.

Similar tests were performed without $H_2S$ gas in the $Al_2O_3$ coating step yield products with uneven coating layers but substantial, i.e., greater than 50%, amounts of the $Al_2O_3$ being in the kappa form which is advantageous for the reasons given in commonly assigned U.S. Pat. No. 4,180,400.

EXAMPLE 17

Inserts are coated similarly to Example 16 except that $TiCl_4$ is added to the gas feed to an amount of 4 %.

EXAMPLE 18

Specimen group (a)

Coating with an intermediate layer of TiC is performed in the reactor of Example 1.

In this reactor vessel 3000 sintered cemented carbide inserts are heated to 1020° C. The inserts to be coated contain WC 86% (by weight), cubic carbides (TiC, TaC, NbC) 9%, balance Co.

The inserts are placed on nets providing good contact with the surrounding gas. The gas, which consists of a mixture containing 4% $CH_4$, 4% $TiCl_4$ and 92% $H_2$, by vol., manufactured in a normal way, is brought to the reactor in one single conduit. The pressure in the reactor is maintained at 7 kPa by sucking out the gas from the reaction vessel by means of a vacuum pump protected from corrosive reaction products (for instance HCl) by the help of a cooling trap with liquid nitrogen situated ahead of the pump. In this way a linear gas flow rate of 1 m/sec is obtained in the charge.

The inserts are treated for 7 hours.

As a result of the treatment, a fine-grained, tight TiC-layer of about 4 μm thickness is obtained. The amount of embrittling η-phase, because of decarburizing, is very small.

The 3000 inserts are treated in the same apparatus with a gas of 5% $CO_2$, 2% HCl, 2% $AlCl_3$, 0.07% $PCl_3$, balance $H_2$.

The temperature of the substratum is 1030° and the pressure 7 kPa. A linear gas flow rate of 3 m/sec is used. After a coating time of 3 hours, a 1 μm thick layer of $Al_2O_3$ is formed on the TiC-coated hard metal inserts. The binding between the $Al_2O_3$ layer and TiC layer is good and almost no embrittling η-phase has been formed in the boundary layer, cemented carbide-TiC-layer.

Small amounts of $Co_2P$ beneath and/or within the $Al_2O_3$ layer are identified optically and by X-ray diffraction. By reducing the amount of $PCl_3$ to only about 0.035 vol %, no $Co_2P$ is formed.

Specimen group (b)

These inserts are treated with similar conditions as in Specimen group (a) except that no $PCl_3$ is added and coating is performed for 8 hours. The inserts have a 1 μm $Al_2O_3$ coating. On the edges of the inserts, however, a coating thickness of 2-8 μm $Al_2O_3$ is obtained.

Comparative test

In a comparative intermittent finishing operation (work piece Steel SIS) 2541: analyses : C=0.36, Si=0.30, Mn=0.7, S=0.03, Cr=1.4, Ni=1.4, Mo=0.2 %, HB (hardness) 290 (work piece diam. 160-140 mm, length 700 mm, with one milled longitudinal slot, width 25 mm) the following test is run:

Cutting speed: 300 m/min
Depth of cut: 1.0 mm
Feed: 0.15 mm

The operation is performed as paired comparative tests of inserts according to the invention (a) and inserts according to (b), resulting in the following relative tool life values:

(a) 1.0
(b) 0.5

EXAMPLE 19

Inserts are produced in a similar manner as described in Example 18. The only difference is that $PH_3$ is used instead of $PCl_3$ Similar results are obtained.

EXAMPLE 20

Inserts are produced in a similar manner as described in Example 18. However, a 0.1 vol % $PCl_3$ is used resulting in an intermediate layer (about 1 μm) of $Co_2P$ beneath the $Al_2O_3$ layer.

EXAMPLE 21

Inserts are produced comprising a surface zone of gamma phase using the following method.

The substrate is chosen in accordance with Example 18.

The inserts are treated in a nitrogen atmosphere (pressure 5 kPa) at 1410° C. for 30 minutes (graphite in the furnace), whereafter the inserts are cooled. Grains of gamma phase have been enriched in the surface zone of the inserts to a 0.5-2 μm thick continuous zone.

Coating with $Al_2O_3$ is performed in accordance with Example 18 but a very thin TiC-layer (0.2 μm) is formed immediately under the $Al_2O_3$-layer.

The TiC coating is deposited in accordance with Example 18 but the duration of the deposition is decreased to 1 h.

No embrittling η-phase can be detected in the surface zones. The inserts have very even layers of $Al_2O_3$ all over the coated objects.

EXAMPLE 22

Inserts are produced as in Example 18 (a) but 0.05% $AsCl_3$ is added to the gas mixture (the amount of $PCl_3$ is reduced accordingly).

EXAMPLE 23

Ceramic inserts are coated in accordance with Example 18. Remarkably evenly distributed layers of $Al_2O_3$ are obtained.

The principles, preferred embodiments and modes of operation of the present invention have been described in the foregoing specification. The invention which is intended to be protected herein, however, is not to be construed as limited to the particlar forms disclosed, since these are to be regarded as illustrative rather than restrictive. Variations and changes may be made by those skilled in the art without departing from the spirit of the invention.

We claim:

1. Method of making a body comprising a substrate or core of one or more cemented carbides or ceramics and at least on thin, wear resistant surface layer consisting essentially of a ceramic oxide in which the substrate is contacted with a gas containing one or more halides of a metal or metals forming the ceramic oxide and a hydrolyzing and/or oxidizing agent at a temperature inthe range of from 700° to 1200° C., to form by chemical vapor deposition the ceramic oxide layer, characterized in that an amount of a dopant selected from the group consisting of sulfur, selenium, tellurium, phosphorus, arsenic, antimonu, bismuth and mixtues thereof is added to the gas whereby the ceramic oxide layer is evenly distributed over the body.

2. Method according to claim 1, wherein the added amount of the said dopant is from about 0.003 to 1% by volume of the total gas volume.

3. Method according to claim 2, wherein the added amount of the said dopant is from about 0.02 to 0.3% by volume of the total gas volume.

4. Method according to claim 1, wherein the ceramic oxide is aluminum oxide.

5. Method according to claim 1, wherein methane is also added to the said gas whereby a significant portion of the aluminum oxide layer is obtained in the kappa form.

6. A chemical vapor deposition method of making an aluminum oxide-coated body wherein a cemented carbide or ceramic substrate is contacted with a gas containing an aluminum halide and hydrolyzing and/or oxidizing agent at a temperature in the range of from 700° to 1200° C., characterized in that methane gas is added to the gas in an amount sufficient to result in at least 85% of the aluminum oxide being in the kappa form.

7. Method of claim 6, wherein the methane gas is added in amount of from about 0.5 to about 90% by volume of the total volume of gas added.

8. Coated body containing at least one metal carbide or ceramic compound on which body there is applied by chemical vapor deposition at a temperature of from 700° to 1200° C. at least one thin, even, wear resistant surface layer consisting essentially of a ceramic oxide, characterized in that the ceramic oxide layer is evenly distributed on the body and at least one of the ceramic oxide layer and the surface zone of the body containing at least one member selected from the group consisting of sulfur, selenium, tellurium, phosphorus, arsenic, antimony and bismuth in an amount sufficient to achieve said even distribution.

9. The coated body of claim 8, wherein the ceramic oxide layer has a thickness of from 0.1 to 20 microns.

10. A the coated body of claim 8, wherein a thin intermediate layer of wear resistant carbide, nitride, carbonitride and/or boride of one or more of the elements Ti, Zr, Hf, V, Nb, Ta, Cr, Mo, W, Si and/or B, is applied between the ceramic oxide layer and the substrate.

11. The coated body of claim 8, wherein the ceramic oxide is aluminum oxide.

12. The coated body of claim 11, wherein at least 85% of the aluminum oxide consists of the kappa form.

13. The coated body of claim 10, characterized in that the thickness of the intermediate layer is from 1 to 8 μm.

14. The coated body of claim 10, characterized in that the thickness of the intermediate layer is from 1.5 to 7 μm.

15. The coated body of claim 10, characterized in that the intermediate layer consists of the carbide, nitride and/or carbonitride of titanium.

16. The coated body of claim 9, wherein a thin intermediate layer of wear resistant carbide, nitride, carbonitride and/or boride of one or more of the elements Ti, Zr, Hf, V, Nb, Ta, Cr, Mo, W, Si and/or B, is applied between the ceramic oxide layer and the substrate.

17. The coated body of claim 16, characterized in that the thickness of the intermediate layer is from 1 to 8 μm.

18. The coated body of claim 16, characterized in that the thickness of the intermediate layer is from 1.5 to 7 μm.

19. The coated body of claim 16, characterized in that the intermediate layer consists of the carbide, nitride and/or carbonitride of titanium.

20. Method according to claim 1, wherein the temperature is in the range of 950° to 1150° C.

21. Method according to claim 6, wherein the temperature is in the range of 950° to 1150° C.

22. Chemical vapor deposition method of making a body comprising a substrate or core of a non-metal and at least one thin, wear resistant surface layer consisting essentially of a ceramic oxide in which the substrate is contacted with a gas containing one or more halides of a metal or metals forming the ceramic oxide and a hydrolyzing and/or oxidizing agent at a temperature in the range of from 700° to 1200° C. to form by chemical vapor deposition the ceramic oxide layer, characterized in that an amount of a dopant selected from the group consisting of sulfur, selenium, tellurium, phosphorus, arsenic, antimony, bismuth and mixtures thereof is added to the gas whereby the layer is evenly distributed over the body.

23. Chemical vapor deposition method according to claim 22, wherein the added amount of said dopant is from about 0.003 to 1 % by volume of the total gas volume.

24. Chemical vapor deposition method according to claim 22, wherein the ceramic oxide is aluminum oxide.

25. Chemical vapor deposition method according to claim 24, wherein methane gas is added to the gas whereby a significant portion of the aluminum oxide layer is in the kappa form.

26. Chemical vapor deposition method according to claim 25, wherein the substrate is a cermic oxide.

27. Coated body containing at least one non-metallic compound on which body there is applied by chemical vapor deposition at a temperature in the range of from 700° to 1200° C. at least one thin, even, wear resistant surface layer consisting essentially of a ceramic oxide characterized in that the cermaic oxide layer is evenly distributed over the body and at least one of the ceramic oxide layer and the surface zone of the body containing at least one member selected from the group consisting of sulfur, selenium, tellurium, phosphorus, arsenic, antimony and bismuth in an amount sufficient to achieve said even distribution.

28. Coated body of claim 27, wherein the said ceramic oxide is aluminum oxide in a thickness of from 0.1 to 20 microns.

* * * * *

UNITED STATES PATENT AND TRADEMARK OFFICE
CERTIFICATE OF CORRECTION

PATENT NO.   :   4,619,866

DATED        :   October 28, 1986

INVENTOR(S) :   Smith et al

It is certified that error appears in the above-identified patent and that said Letters Patent is hereby corrected as shown below:

Face of patent, section [63], amend "continuation of Ser. No. 285,798" to --continuation-in-part of Ser. No. 285,798--; and section [30], add --Jan. 26, 1982   [SE] Sweden . . . . 8200400 --.

Signed and Sealed this

Twenty-eighth Day of April, 1987

Attest:

DONALD J. QUIGG

Attesting Officer

Commissioner of Patents and Trademarks

UNITED STATES PATENT AND TRADEMARK OFFICE
CERTIFICATE OF CORRECTION

PATENT NO. : 4,619,866
DATED : October 28, 1986
INVENTOR(S) : Smith et al

It is certified that error appears in the above-identified patent and that said Letters Patent is hereby corrected as shown below:

In Fig. 2, bottom right hand corner, amend "H" to --$H_2$--.

In column 3, line 46, amend "aditions" to --additions--.

In column 4, line 54, amend "carbide" to --carbides--.

line 55, amend "carbonitride" to --carbonitrides--.

In column 5, line 27, amend "oxyen" to --oxygen--.

In column 11, line 14, amend "0.5%" to --0.05%--.

In column 13, line 31, amend "Feed: 0.15 mm" to --Feed rate: 0.15 mm/rev--.

In column 14, line 23, amend "on" to --one--.

line 27, amend "inthe" to --in the--.

UNITED STATES PATENT AND TRADEMARK OFFICE
CERTIFICATE OF CORRECTION

PATENT NO. : 4,619,866

DATED : October 28, 1986

INVENTOR(S) : Smith et al

It is certified that error appears in the above-identified patent and that said Letters Patent is hereby corrected as shown below:

In column 16, line 24, amend "cermic to --ceramic--.

Signed and Sealed this

Third Day of November, 1987

*Attest:*

DONALD J. QUIGG

*Attesting Officer*      *Commissioner of Patents and Trademarks*